United States Patent [19]

Lee et al.

[11] 4,040,016
[45] Aug. 2, 1977

[54] TWIN NODES CAPACITANCE MEMORY

[75] Inventors: Hsing-San Lee, Williston; Norbert George Vogl, Jr., Colchester, both of Vt.

[73] Assignee: International Business Machines Corporation, Armonk, N.Y.

[21] Appl. No.: 672,196

[22] Filed: Mar. 31, 1976

[51] Int. Cl.² .................. G11C 11/24; G11C 11/40
[52] U.S. Cl. .................. 340/173 CA; 340/173 R; 357/24
[58] Field of Search .................. 340/173 R, 173 CA; 307/238; 357/24, 44

[56] References Cited

U.S. PATENT DOCUMENTS

| 3,986,180 | 10/1976 | Cade | 340/173 R |
|---|---|---|---|
| 3,987,474 | 10/1976 | Walker | 340/173 CA |

*Primary Examiner*—Vincent P. Canney
*Attorney, Agent, or Firm*—Stephen J. Limanek

[57] ABSTRACT

A semiconductor memory produced in a unipolar technology includes a cell which has a pair of inversion capacitors with one terminal of each capacitor connected to one of a pair of bit/sense lines, the other terminal of each capacitor is coupled to a source of charges by a pulse from a word line. The charges produced from the source may be in the form of pulses injected into the capacitors. To provide a word organized array of these cells, each word includes a source of charges produced at the surface of a semiconductor substrate and a plurality of pairs of inversion capacitors formed also at the surface of the semiconductor in spaced apart relationship from the charge source. Information is written into the pairs of capacitors by applying complementary voltages to each pair of bit/sense lines coupled to the pairs of capacitors while a word pulse produces inversion layers at the surface of the substrate between the capacitors to interconnect serially the charge source with each of the capacitors. The complementary voltages have a first and a second magnitude. When voltages of the first and second magnitudes are applied to first and second bit/sense lines, respectively, of a pair of bit/sense lines, a 1 bit of information is stored in the associated cell, and when voltages of the second and first magnitudes are applied to the first and second bit/sense lines, respectively, of the same pair of bit/sense lines, a 0 bit of information is stored in the associated cell. The capacitor of the pair of capacitors having the larger voltage applied thereto stores the greater amount of charge. By employing a differential sense amplifier and floating the pair of bit sense line when a word pulse again connects the charge source with each of the capacitors, the greater charge can be detected by noting the polarity of the different voltage between the two capacitors of the pair of capacitors.

17 Claims, 5 Drawing Figures

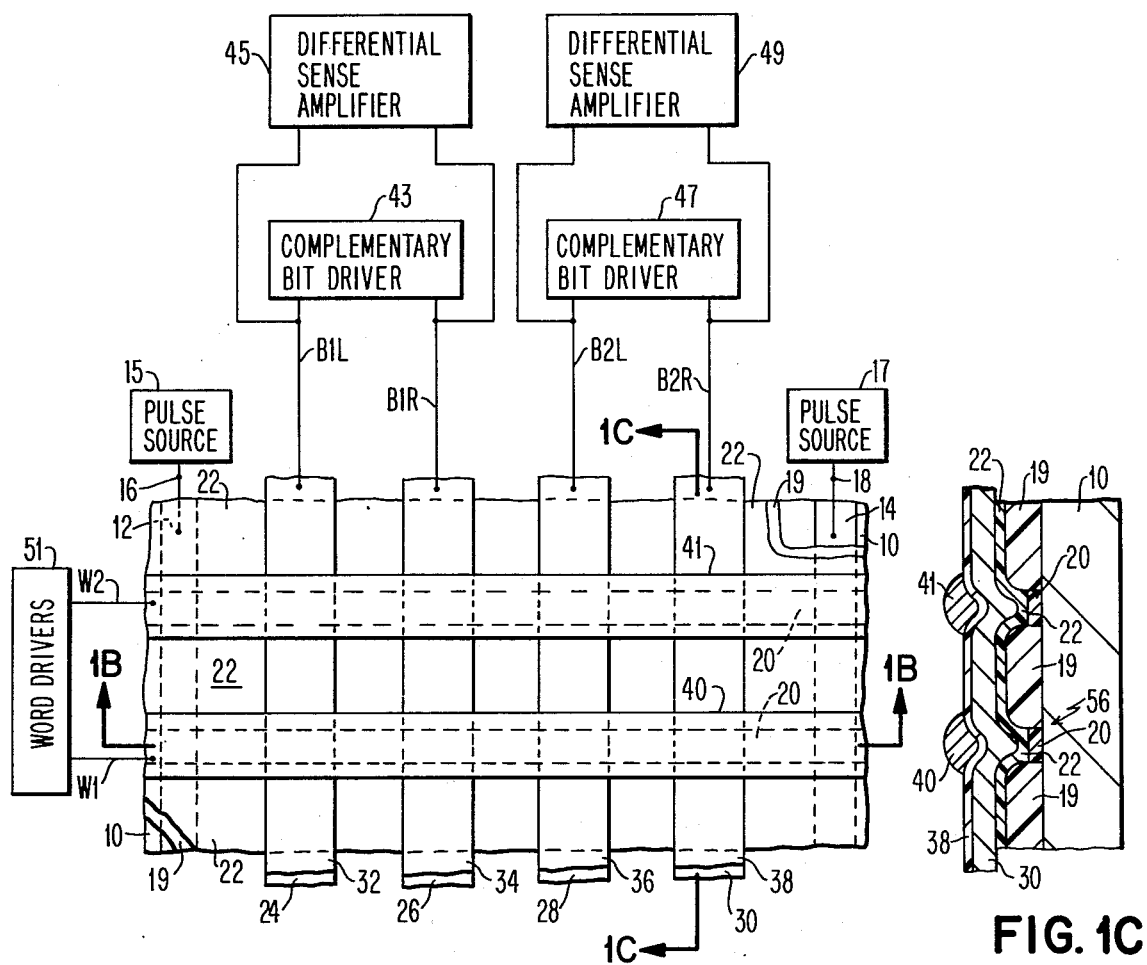
FIG. 1A
FIG. 1C
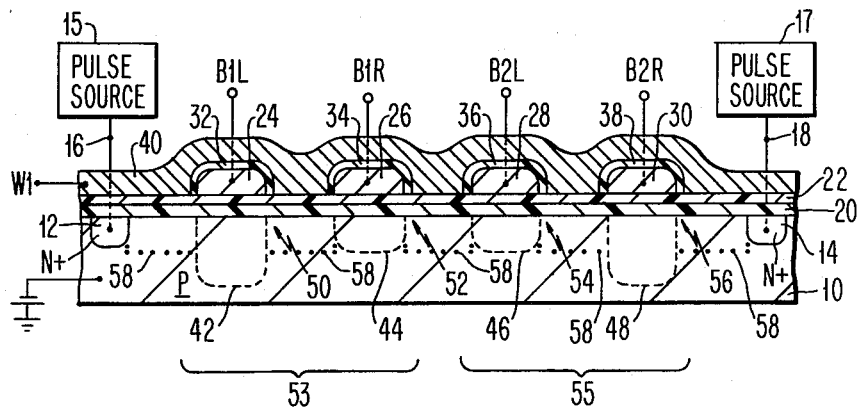
FIG. 1B

TWIN NODES CAPACITANCE MEMORY

BACKGROUND OF THE INVENTION

1. Field of the Invention

This invention relates to integrated semiconductor memory circuits and more particularly to memory circuits which employ capacitors for storing binary digits of information.

2. Description of the Prior Art

Integrated semiconductor memory circuits, particularly those employing cells which include essentially a storage capacitor and a switch, have achieved high memory cell densities. One of the simplest circuits for providing small memory cells is described in commonly assigned U.S. Pat. No. 3,387,286, filed July 14, 1967, by R. H. Dennard. Each of these cells employs a storage capacitor and a field effect transistor acting as a switch to selectively connect the capacitor to a bit/sense line. In also commonly assigned U.S. Pat. No. 3,811,076, by W. M. Smith, and U.S. Pat. No. 3,841,926 by R. H. Garnache and W. M. Smith, both filed Jan. 2, 1973, there is disclosed a one device field effect transistor memory cell of the type described in the above identified Dennard patent which is made to a small size by utilizing a layer of doped polycrystalline silicon separated by a dielectric medium disposed on the surface of a semiconductor substrate for forming a storage capacitor. These latter two patents also teach a process which uses very effectively a dual insulation layer of silicon dioxide and silicon nitride.

In commonly assigned copending application having Ser. No. 587,528, filed on June 16, 1975, by W. D. Pricer and J. E. Selleck there is described a memory array made of small cells which employ storage capacitors and bipolar transistors. In this latter array, which is word organized, each storage capacitor of these cells has simply one capacitor terminal connected to a separate bit/sense line while selected cells forming a word are simultaneously accessed by utilizing a word pulse for coupling to the other terminal of the storage capacitors of that word. By simultaneously accessing the other terminal of all storage capacitors of a particular word, isolation between cells of the word is not required.

In another commonly assigned application having Ser. No. 672,197, entitled "Capacitor Storage Memory", and filed on even date by W. D. Pricer, there is disclosed a capacitor memory produced in a unipolar technology which is provided with very small cells, each of which includes substantially only a storage capacitor having a bit/sense line connected to one terminal of the capacitor and a word line providing a coupling to the other terminal of the capacitor. In an embodiment of that invention, a direct current source of charges is produced at the surface of a semiconductor substrate and a plurality of inversion storage capacitors are formed also at the surface of the semiconductor substrate in a spaced apart relationship from the charge source. Voltage pulses representing binary digits are applied to one terminal of the capacitors and the other terminal of the capacitors is coupled to the direct current source of charges by the application of a word pulse to a word line.

In yet another commonly assigned application having Ser. No. 672,198, entitled "Injected Charge Capacitor Memory" and filed on even date by H. S. Lee, there is disclosed a random access capacitor memory which utilizes pulse charge injection for producing puddles or packets of charge representing binary digits.

*IBM Technical Disclosure Bulletin,* Vol. 18, No. 3, August 1975, pages 786 and 787, in an article entitled "Semiconductor Storage Circuit Utilizing Two Device Memory Cells" and U.S. Pat. No. 3,771,148, filed Mar. 31, 1972, teach the use of a pair of capacitors for storing complementary signals in a single cell.

SUMMARY OF THE INVENTION

It is an object of this invention to provide an improved memory cell having a small area and higher speed which utilizes a pair of storage capacitors and simplified switching means.

It is another object of this invention to provide an improved memory array which has high density with cells having stronger signals.

It is still another object of this invention to provide a high density memory array having cells which operate at higher speeds and which is simple and inexpensive to fabricate.

Yet a further object of this invention is to provide an improved memory array which is less sensitive to noise and tolerances with cells having stronger signals without the cells being dependent on their position in the array.

A further object of this invention is to provide an improved word organized, dense and high speed memory array with reduced bit interference.

Still another object of this invention is to provide an improved high speed memory array wherein bit pattern dependence is significantly alleviated.

In accordance with the teaching of this invention, a memory cell is produced in a semiconductor substrate having a given conductivity type by providing a source of charges at the surface of the substrate and first, second and third conductive plates with a dielectric medium disposed between the substrate and the plates. A word line is connected to the first plate and a pair of bit/sense lines is connected to the second and third plates. A voltage pulse on the word line and complementary voltages on the bit/sense lines produce inversion layers at the substrate surface to form, with the plates, inversion capacitors. The first, second and third plates are arranged so that a continuous inversion layer is formed from the charge source to one of the inversion capacitors through the inversion layer of the other two capacitors. Information is stored in the two inversion capacitors of the cell by storing predetermined amounts of charges, preferably electrons, from the charge source into depletion wells of the two capacitors produced by the complementary voltages on the pair of bit lines. The information is read by employing a differential sense amplifier and floating the pair of bit/sense lines when a word pulse again connects the charge source with the two inversion capacitors of the cell. The polarity of the voltage of the detected stored charge indicates the information stored in the cell in complementary form.

The foregoing and other objects, features and advantages of the invention will be apparent from the following more particular description of the preferred embodiment of the invention, as illustrated in the accompanying drawings.

BRIEF DESCRIPTION OF THE DRAWINGS:

FIG. 1A is a plan view of an embodiment of a semiconductor memory array of the present invention, FIG. 1B is a section taken through FIG. 1A at 1B—1B, FIG. 1C is a section taken through FIG. 1A at 1C—1C, FIG. 2 are a series of schematic diagrams indicating charge flow into depletion wells at different time periods.

Figure 2:
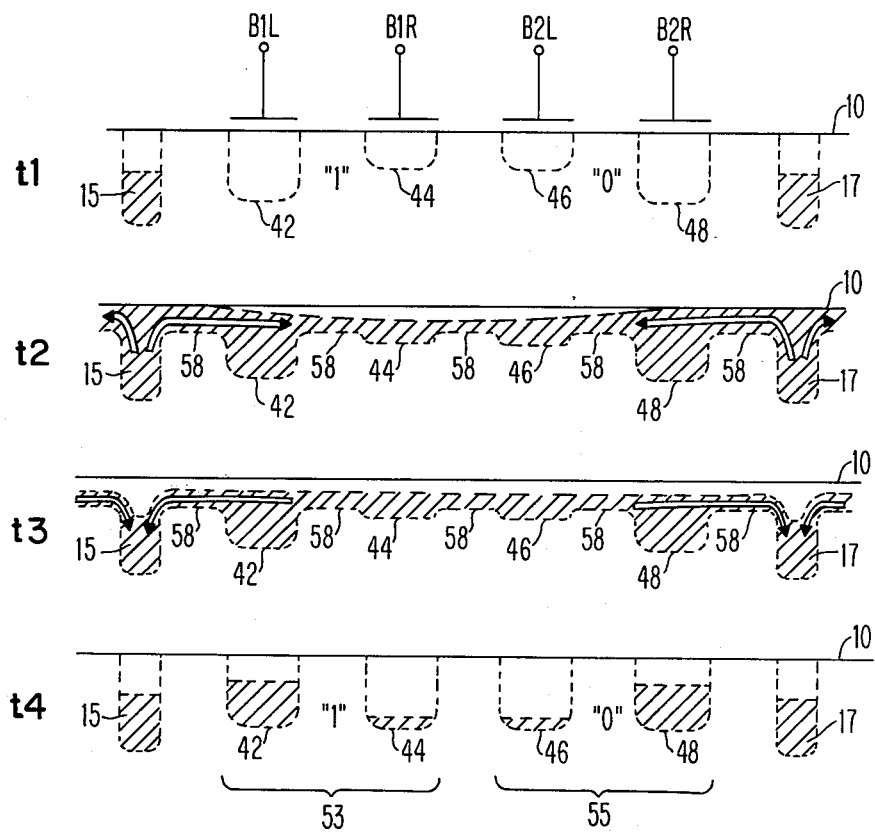

DESCRIPTION OF THE PREFERRED EMBODIMENTS:

Referring to FIGS. 1A, 1B and 1C in more detail, there is shown the memory array of the invention which includes a semiconductor substrate 10 having disposed therein diffusion regions 12 and 14. The substrate 10 may be of p type conductivity with the diffusion regions 12 and 14 of $n+$ type. Terminals 16 and 18 connect pulse sources 15 and 17 to diffusion regions 12 and 14, respectively, for producing pulses of charge. If desired, sources 15 and 17 may simply be direct current voltage sources of appropriate voltage magnitude. Thick oxide strips 19, or, if desired recessed oxide, are provided to isolate word lines W1 and W2 from each other. Disposed on the surface of the semiconductor substrate 10 between thick oxide strips 19 is a first insulation layer 20 which is preferably made of silicon dioxide. A second insulation layer 22, preferably made of silicon nitride, is formed over the first insulation layer 20 and over the thick oxide strips 19. The thickness of the silicon dioxide layer 20 may be, for example, 500 angstroms and the thickness of the silicon nitride layer 22 may be, for example, 200 angstroms. A plurality of conductive lines 24, 26, 28 and 30, arranged parallel to each other, are disposed over the insulating layers 20 and 22 between the diffusion regions 12 and 14. The conductive lines 24, 26, 28 and 30, preferably made of doped polycrystalline silicon, are covered with insulating layers of oxidized polycrystalline silicon 32, 34, 36 and 38, respectively. Metal lines 40 and 41 are disposed over the conductive lines 24, 26, 28 and 30 in a direction orthogonal to the direction of the conductive lines 24, 26, 28 and 30. The conductive lines and the metal lines are insulated from each other by the insulating layers 32, 34, 36, and 38. The conductive lines 24, 26, 28 and 30 are portions of bit/sense lines B1L, B1R, B2L and B2R. Bit/sense lines B1L and B1R are connected to complementary bit driver 43 and to differential sense amplifier 45 and B2L and B2R are connected to complementary bit driver 47 and to differential sense amplifier 49. The metal lines 40 and 41 are portions of the word lines W1 and W2, and are connected to word driver 51 which produces the necessary word pulses for word lines W1 and W2. Bit drivers 43 and 47 include any suitable bit drivers for producing complementary voltage pulses on bit/sense lines B1L and B1R, and B2L and B2R, respectively, and may also provide any desired bias voltage to these lines.

The complementary voltage pulses applied to these bit/sense lines produce depletion wells in the semiconductor substrate 10, as indicated by dashed lines 42, 44, 46 and 48 in FIG. 1B. The depth of each of these depletion wells depends upon the magnitude of the voltage applied to the respective conductive lines 24, 26, 28 and 30. These conductive lines 24, 26, 28 and 30 along with the depletion wells and the dual insulating layers 20 and 22 form storage capacitors 50, 52, 54 and 56 of the word line W1 defined by metal line 40. Likewise, word line W2 is associated with storage capacitors similar to capacitors 50, 52, 54 and 56. The storage capacitors associated with word line W2 are located at the intersection of the conductive lines 24, 26, 28 and 30 and the metal line 41. It can be seen in FIG. 1B that the depletion wells 42 and 48 associated with storage capacitors 50 and 56 are deeper than the potential wells 44 and 46 associated with capacitors 52 and 54, respectively. It should be noted that the deeper potential wells 42 and 48 have adjacent thereto shallower wells 44 and 46, respectively. The deep well 42 and the shallower well 44 are associated with the pair of bit lines B1L and B1R, respectively, which are used to write information into and read information out of the storage capacitors 50 and 52, forming a first cell 53 of the word line W1. A second cell 55 of word line 1 has storage capacitors 54 and 56. Of course, word line 1 would have additional cells but in the interest of clarity are not shown. It will be assumed that when complementary voltage pulses on bit/sense line B1L and B1R produce the deep well 42 at capacitor 50 and the shallower well 44 at capacitor 52 a 1 bit of information is stored in cell 53 and when a deep potential well is produced at capacitor 52 and a shallower well at capacitor 50 and 0 bit of information is stored in cell 53. As noted in cell 55, a 0 bit of information is indicated as being stored therein with the deep well being associated with the right bit/sense line B2R and the shallower well being associated with the left bit line B2L.

In order to store information in capacitors 50, 52, 54 and 56 it is necessary to introduce charges into the potential wells of these capacitors from the diffusion regions 12 and 14. To introduce charges into the depletion wells 42, 44, 46, and 48, a conductive path is selectively produced between the sources 12 and 14 and each of the depletion wells 42, 44, 46 and 48. This path is produced by creating additional depletion wells 58 at the surface of the semiconductor substrate 10 between the diffusion regions 12 and 14 and the depletion wells 42 and 48, respectively, and also between the depletion wells 42 and 44, 44 and 46, and 46 and 48. These depletion wells 58, as indicated in FIG. 1C of the drawing, are produced by a word pulse having a positive polarity applied from word driver 51 to the word line W1. The charges flow from the diffusion regions 12 and 14 through depletion wells 58 into potential wells that are at a potential initially more positive than the potential applied to terminals 16 and 18 to form an inversion layer at the surface of the substrate 10. After depletion wells 42, 44, 46 and 48 are filled with the charges, the word pulse is terminated and the depletion wells 42, 44, 46 and 48, now forming inversion layers for inversion storage capacitors 50, 52, 54 and 56, are isolated from the charge sources 12 and 14 and from each other. The voltages on the two pairs of bit lines B1L and B1R, and B2L and B2R, representing the binary information are pulsed back to the rest potential after the word line pulse has terminated and puddles or packets of charge of two different magnitudes remain in potential wells to represent the stored binary digits. When reading the stored information from the capacitors 50, 52, 54 and 56, the bit drivers are disconnected from the bit lines B1L, B1R, and B2L and B2R and differential sense amplifiers 45 and 49 are connected between the pairs of bit/sense lines B1C and B1R and the pair of bit/sense lines B2L and B2R, respectively, as is well known in the art.

Figure 3:
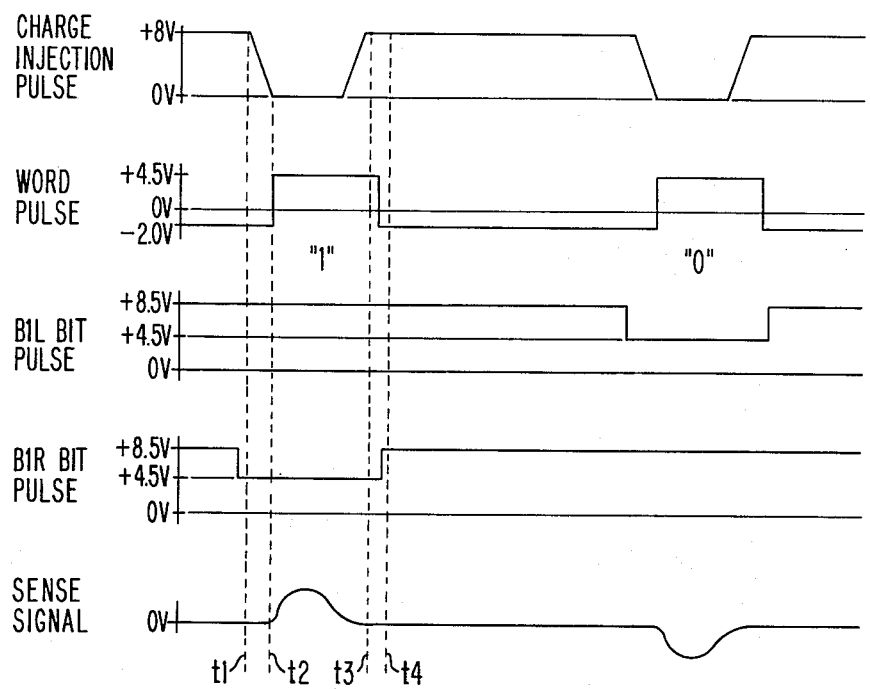
FIG. 3 is a pulse program used to operate the memory array of the present invention.

In FIG. 2 there is shown a series of schematic diagrams showing charge flow from the pulsed charge sources 15 and 17 at the different time periods indicated in the pulse program of FIG. 3 which is used in the operation of the memory array in accordance with the teachings of this invention. As can be seen from the pulse program of FIG. 3, pulse sources 15 and 17 produce a charge injection pulse which is normally at +8.0 volts but is lowered to zero volts at predetermined intervals. The substrate 10 is preferably biased at −3.0 volts. The word pulse applied selectively to word line W1 and word line W2 varies between −2.0 and +4.5 volts and each of the bit lines used to write information into the cells has a rest potential of +8.5 volts. To store a 1 bit of information in cell 53, a voltage of +8.5 volts is maintained on bit/sense line B1L and a voltage of +4.5 volts is applied to bit/sense line B1R to produce the potential wells 42 and 44, respectively. Thereafter, charge is introduced into the wells from sources 15 and 17. When information is being read from the cell 53, the bit/sense line having less charge stored therein experiences a relatively strong positive charge signal while the bit/sense line having more charge stored therein has applied thereto only a signal of substantially zero magnitude. To store a 0 bit of information in cell 53 the size of potential wells 42 and 44 is reversed, thus appearing as the wells do in cell 55 with the right well being deeper than the left well. In the differential sense amplifier 45 the signal produced for the 0 bit of information has a polarity opposite to that of the signal produced for the 1 bit of information.

Referring to FIGS. 2 and 3 in more detail, it can be seen that at time t1, when a 1 bit is being written into bit/sense lines B1L and B1R, the bit pulse voltage from complementary bit driver 43 decreases to +4.5 volts for bit/sense line B1R while B1L remains at +8.5 volts, with the charge injection pulse at +8 volts, which prevents pulse sources 15 and 17 from supplying charge to the substrate 10. Furthermore, the word pulse, which is at −2.0 volts, will not produce depletion wells 58. Accordingly, as can be seen at t1 in FIG. 2, depletion wells 42, 44, 46 and 48 have been formed in the substrate 10 but no charges have been introduced into these wells from pulse sources 15 and 17. At time t2 the charge injection pulse is lowered to zero volts providing a large supply of charges which flow into the potential wells 42, 44, 46 and 48 as soon as the word pulse is raised to +4.5 volts to produce the potential wells 58. The potential wells 58 provide a conductive path between the pulse sources 15 and 17 and the potential wells 42, 44, 46 and 48. Charges are indicated in FIG. 2 as shaded lines. By lowering the pulse source voltage to zero volts, a large overdrive condition is created which rapidly fills the potential wells 42, 44, 46 and 48 with charge, as indicated in FIG. 2 at t2. At time t3, after the wells have been filled, the charge injection pulse is again raised to +8 volts which now causes the pulse sources 15 and 17 to act as drains which attract all charges in the depletion wells 42, 44, 46 and 48 above the barrier level produced by depletion wells 58, as indicated in t3 of FIG. 2. After all excess charges have been drained into the pulse sources 15 and 17, the word pulse voltage is lowered to −2.0 volts to very securely trap the remaining charges in the wells 42, 44, 46 and 48. It can be seen in t3 of FIG. 2 that very little, if any, charge remains in the potential wells 44 and 46 since these wells are at substantially the same potential as potential wells 58, both being produced by the +4.5 volts applied to the dual insulation medium 20, 22. Furthermore, the wells 42, 44, 46 and 48 are now isolated and the bit pulse voltage is returned to the rest potential of +8.5 volts with relatively large puddles or packets of charge remaining in depletion wells 42 and 48, and little or no charge being stored in depletion wells 44 and 46, as shown at t4 in FIG. 2. It should be noted from FIG. 3 that when a 1 bit of information is to be written into a cell the bit pulse voltage simply remains at the rest potential of +8.5 volts on the bit/sense line at the left side of the cell and the bit pulse voltage applied to the bit/sense line at the right side of the cell is lowered to +4.5 volts. During the read operation, the bit pulse voltage on all bit lines is floated from the rest potential of +8.5 volts and the lines are connected to the differential sense amplifiers 45 and 49, and the charge injection pulse and the word pulse are set as indicated in FIG. 3 during times t1 through t4 with the sense signal produced by differential sense amplifier 45 indicating a relatively large positive pulse for 1 bits of information and as indicated in FIG. 3 a relatively large negative pulse for 0 bits of information, such as that stored in cell 55.

It should be noted that when only a single storage capacitor, such as capacitor 50, is used to store information, a reference voltage having a value or magnitude approximately midway between the two possible storage signal values is used in the sense amplifier. Accordingly, in, for example, a sense amplifier utilizing a flip-flop circuit, a reference voltage of +1.5 volts would be applied to one input of the circuit with the other input having a +3.0 volts or zero volt storage signal applied thereto, depending upon the information stored. It can be seen that in one instance the differential signal is of a positive polarity and in the other instance the signal is negative. In either instance the absolute difference between the voltages applied to the inputs of the circuit is only one half the difference between the two storage or bit signals 0 and +3 volts. When using the two capacitors or nodes for one cell, the voltage from one of the capacitors is applied to one of the inputs of the sense amplifier and the voltage from the other capacitor is applied to the other input of the sense amplifier. With this arrangement, if a +3 volts signal is derived from one capacitor and a zero volt signal is derived from the other capacitor an absolute difference voltage of 3 volts is applied to the two inputs of the sense amplifier. This stronger signal is useful in many memory applications. Furthermore, this structure is symmetrical and is less sensitive to noise and tolerances.

Although a reading technique has been described hereinabove, it should be understood that other reading arrangements may be employed. For example, if desired, both of the lines of the pair of bit/sense lines may be placed at an intermediate voltage level, the lines then floated and the word pulse applied to the word line to cause a partial charge exchange between the two potential wells of the cell.

It should also be noted that since information is stored in complementary form there is an equal number of substantially empty wells, such as wells 44 and 46, and substantially filled wells, such as 42 and 46. Thus, when one bit of information in a cell is to be replaced by the other bit of binary information, for example, a 0 bit replaces a 1 bit, the charge in one of the two potential wells is simply transferred to the other well, the charge source need only supply the charge lost by leakage. These sloshing arrangements provide for rapid storing of new information into the cells. When employing the sloshing arrangements, isolation gates should be used between the array of storage cells and the charge sources.

If a direct current charge source is employed, the direct current voltage applied to diffusion regions 12 and 14 should be set at approximately 1 volt below the cut off voltage. This charge source can automatically replenish the charge leakage.

Of course, it should be understood that since the memory of this invention utilizes dynamic cells, it must be refreshed within predetermined time intervals in order to prevent the loss of stored information. Any known suitable refreshing technique may be employed.

While the invention has been particularly shown and described with reference to a preferred embodiment thereof, it will be understood by those skilled in the art that various changes in form and details may be made therein without departing from the spirit and scope of the invention.

What is claimed is:

1. A capacitance memory comprising,
   a semiconductor substrate,
   a dielectric medium disposed on said substrate,
   first and second conductive means disposed on said dielectric medium defining first and second storage nodes at first and second given regions on the surface of said substrate,
   means for applying complementary data signals to said first and second storage nodes,
   a source of reference potential disposed on the surface of said substrate at a third given region of said substrate,
   means for selectively coupling said source of reference potential to said first and second given regions, and
   means coupled to said first and second storage nodes for differentially sensing said complementary date signals.

2. A capacitance memory as set forth in claim 1 wherein said first and second conductive means forms first and second inversion capacitors, respectively, each having an inversion layer and said selectively coupling means couples said source to said inversion layer.

3. A capacitance memory as set forth in claim 2 wherein said selectively coupling means includes a conductive medium having a word pulse applied thereto.

4. A capacitance memory as set forth in claim 3 wherein said complementary date signals include a first voltage having a first given magnitude and a second voltage having a second given magnitude substantially greater than said first magnitude.

5. A capacitance memory as set forth in claim 4 wherein said applying means provides a rest potential to said first and second inversion capacitors.

6. A capacitance memory as set forth in claim 5 wherein said applying means applies said rest potential to said first and second inversion capacitors at said voltage.

7. A capacitance memory as set forth in claim 6 wherein said applying means disconnects said rest potential from said first and second inversion capacitors to produce a floating condition during a given time period, said selectively coupling means couples said reference potential to said inversion capacitors and said differentially sensing means are coupled to storage nodes during said given time period.

8. A capacitance memory as set forth in claim 7 wherein said first and second conductive means are disposed adjacent to each other to form a single storage cell.

9. A capacitance memory as set forth in claim 8 wherein said selectively coupling means provides a voltage having a magnitude substantially equal to that of said first voltage.

10. A capacitance memory comprising,
    a semiconductor substrate having a first type conductivity and a given region therein having a conductivity opposite to that of said first type conductivity,
    means for applying a reference voltage to said given region for producing a source of charges,
    an insulating medium disposed on said substrate,
    a plurality of pairs of spaced apart conductive lines disposed on said insulating medium,
    a conductive control line arranged on said insulating medium and substantially orthogonal to and over said plurality of pairs of lines, said control line extending from said source of charges to each of said spaced apart conductive lines,
    means for applying complementary date signals to each pair of said plurality of pairs of conductive lines, and
    means for applying a control voltage pulse to said control line to couple said source of charges to each of said spaced apart conductive lines.

11. A capacitance memory as set forth in claim 10 wherein the conductive lines of each pair of said plurality of pairs of conductive lines are disposed adjacent to each other.

12. A capacitance memory as set forth in claim 11 wherein said signals applying means applies a first signal having a first given magnitude and a second signal having a second given magnitude substantially greater than said first given magnitude for producing potential wells of different depths in said semiconductor substrate.

13. A capacitance memory as set forth in claim 12 further including means for selectively applying a bias voltage to each of said spaced apart lines as a rest potential during a first period of time.

14. A capacitance memory as set forth in claim 12 wherein said control voltage pulse applying means applies the control pulse with a magnitude equal to that of said first signal.

15. A capacitance memory as set forth in claim 13 wherein said bias voltage applying means disconnects said bias voltage from said spaced apart lines to produce a floating condition on said spaced apart lines during a second period of time and said control voltage pulse means couples said reference voltage means to said potential wells during said second period of time and further including means coupled to each pair of said plurality of pairs of conductive lines during said second period of time to differentially sense charge flowing into said potential wells.

16. A capacitance memory as set forth in claim 5 wherein said applying means applies said rest potential to said first and second inversion capacitors at a voltage intermediate said first and second given magnitudes.

17. A capacitance memory as set forth in claim 13 further including means for selectively applying a bias voltage to each of said spaced apart lines as a rest potential having a magnitude intermediate said first and second given magnitudes.

* * * * *